(12) United States Patent
Madocks

(10) Patent No.: US 7,023,128 B2
(45) Date of Patent: Apr. 4, 2006

(54) DIPOLE ION SOURCE

(75) Inventor: John Madocks, Tucson, AZ (US)

(73) Assignee: Applied Process Technologies, Inc., Tucson, AZ (US)

( * ) Notice: Subject to any disclaimer, the term of this patent is extended or adjusted under 35 U.S.C. 154(b) by 292 days.

(21) Appl. No.: 10/475,547

(22) PCT Filed: Apr. 10, 2002

(86) PCT No.: PCT/US02/11541

§ 371 (c)(1),
(2), (4) Date: Oct. 20, 2003

(87) PCT Pub. No.: WO02/086937

PCT Pub. Date: Oct. 31, 2002

(65) Prior Publication Data

US 2004/0135485 A1 Jul. 15, 2004

Related U.S. Application Data

(60) Provisional application No. 60/285,360, filed on Apr. 20, 2001, provisional application No. 60/285,361, filed on Apr. 20, 2001, provisional application No. 60/285,364, filed on Apr. 20, 2001.

(51) Int. Cl.
H05H 1/46 (2006.01)
H05H 1/54 (2006.01)

(52) U.S. Cl. ............................. 313/359.1; 313/231.31; 313/231.71; 315/111.71; 315/111.81; 118/723 FI; 118/718; 204/298.04

(58) Field of Classification Search ............. 313/359.1, 313/231.31, 231.61, 231.71; 315/111.21, 315/111.41, 111.71, 111.81; 204/298.04, 204/298.36, 298.41; 118/718, 723 CB, 723 FE, 118/723 MP, 723 EB, 723 VE, 723 FI; 156/345.39, 156/345.4; 219/106, 121.12, 121.15, 121.52, 219/69.12, 92
See application file for complete search history.

(56) References Cited

U.S. PATENT DOCUMENTS

| 2,146,025 | A | 2/1939 | Penning |
| 4,361,472 | A | 11/1982 | Morrison, Jr. |
| 4,624,767 | A | 11/1986 | Obinata |
| 4,631,106 | A | 12/1986 | Nakazato et al. |

(Continued)

OTHER PUBLICATIONS

Roth, "Industrial Plasma Engineering, vol. 1; Principles", Figure 9.31, IOP Publishing, Ltd. 1995, pp. 200-208.

(Continued)

Primary Examiner—Ashok Patel
(74) Attorney, Agent, or Firm—Cahill, von Hellens & Glazer, P.L.C.

(57) ABSTRACT

A dipole ion source (FIG. 1) includes two cathode surfaces, a substrate (1) and a pole (3); wherein a gap is defined between the substrate and the pole; an unsymmetrical mirror magnetic field including a compressed end, wherein the substrate is positioned in the less compressed end of the magnetic field; and an anode (4) creating an electric field penetrating the magnetic field and confining electrons in a continuous Hall current loop, wherein the unsymmetrical magnetic field serves an ion beam on the substrate.

19 Claims, 7 Drawing Sheets

U.S. PATENT DOCUMENTS

| | | | |
|---|---|---|---|
| 4,710,283 A * | 12/1987 | Singh et al. | 204/298.01 |
| 4,761,219 A | 8/1988 | Sasaki et al. | |
| 4,767,516 A | 8/1988 | Nakatsuka et al. | |
| 4,842,683 A | 6/1989 | Cheng et al. | |
| 4,847,476 A | 7/1989 | Sato et al. | |
| 4,862,032 A | 8/1989 | Kaufman et al. | |
| 4,863,756 A | 9/1989 | Hartig et al. | |
| 4,963,524 A | 10/1990 | Yamazaki | |
| 5,000,834 A | 3/1991 | Yoshikawa | |
| 5,189,446 A * | 2/1993 | Barnes et al. | 315/111.41 |
| 5,224,441 A | 7/1993 | Felts et al. | |
| 5,225,024 A | 7/1993 | Hanley et al. | |
| 5,274,306 A * | 12/1993 | Kaufman et al. | 315/111.41 |
| 5,328,583 A | 7/1994 | Kameyama et al. | |
| 5,359,258 A | 10/1994 | Arkhipov et al. | |
| 5,364,665 A | 11/1994 | Felts et al. | |
| 5,437,725 A | 8/1995 | Schuster et al. | |
| 5,838,120 A | 11/1998 | Semenkin et al. | |
| 6,066,826 A | 5/2000 | Yializis | |
| 6,077,403 A | 6/2000 | Kobayashi et al. | |
| 6,919,672 B1 * | 7/2005 | Madocks | 313/359.1 |

OTHER PUBLICATIONS

Musil, et al., "Unbalanced magnetrons and new sputtering systems with enhanced plasma ionization", American Vacuum Society, Journal of Vacuum Science and Technology A 9 (3), May/Jun. 1991, pp. 1171-1177.

Decker, et al., "Surface Functionalization of Polymer Films and Webs Using Subatmospheric Plasmas", Society of Vacuum Coaters 41st Annual Technical Conference Proceedings, 1998, pp. 355-357.

* cited by examiner

DIPOLE ION SOURCE

CROSS REFERENCE TO RELATED APPLICATIONS

The present patent application is 371 of the earlier filed PCT application PCT/US02/11541 filed on Apr. 10, 2002, which claims benefits of U.S. Provisional patent applications Ser. Nos. 60/285,360; 60/285,361 and 60/285,364, each of which filed on Apr. 20, 2001 and each of which is hereby incorporated by reference.

This application also incorporates by reference PCT applications Ser. Nos. PCT/US02/11473 and PCT/US02/11542, each of which designating the U.S. with international filing date Apr. 10, 2002.

BACKGROUND

The present invention relates to a dipole ion source. Before turning to the detailed description of the presently preferred embodiments, related prior art is discussed below. The related prior art is grouped into the following sections: extended acceleration channel ion sources, anode layer ion sources, Kaufman type ion sources, Penning discharge type ion sources, facing target sputtering, plasma treatment with a web on a drum, and other prior art methods and apparatuses.

Extended Acceleration Channel Ion Sources

Extended acceleration channel ion sources have been used as space thrust engines and for industrial ion sources for many years. The embodiments described in U.S. Pat. No. 5,359,258 to Arkhipov et al. are typical examples of these sources. These sources have a separate electron source to provide electrons to the ion source. Pole erosion is an issue with these sources.

Anode Layer Ion Sources

Anode layer ion sources (see U.S. Pat. No. 5,838,120 to Semenkin et al.) are another variation of ion source that places the anode to interrupt a portion of the electron containing magnetic field. These sources do not require a separate electron source. Recently, they have been commercialized for industrial use by Advanced Energy Industries, Inc. and other vendors. Similar to the extended acceleration channel sources, the substrate is placed outside the containing magnetic field, outside the gap between cathode surfaces.

Kaufman Type Ion Sources

Kaufman, working at NASA, developed this type of ion source to a high level in the early 1960's (see J. Reece Roth, *Industrial Plasma Engineering, Volume 1: Principles*, pp 200–204, IOP Publishing, Ltd. 1995). These sources place the substrate outside of the electron confining magnetic field.

Penning Discharge Type Ion Sources

Several variations of a Penning discharge type ion source are discussed in J. Reece Roth, *Industrial Plasma Engineering, Volume 1: Principles*, pp 204–208 and FIG. 9.31, IOP Publishing, Ltd. 1995.

Facing Target Sputtering

U.S. Pat. No. 4,963,524 to Yamazaki shows a method of producing superconducting material. An opposed target arrangement is used with the substrate positioned between the electrodes in the magnetic field. In this method, the magnetic field is symmetrical between the electrodes and the substrates are in the middle of the gap. When the substrates are placed in this position, the tall current generated within the magnetic field tends to be distorted and broken, and the plasma is extinguished and/or the voltage is much higher.

Plasma Treatment with a Web on a Drum

In U.S. Pat. Nos. 5,224,441 and 5,364,665 to Felts et al., a flexible substrate is disposed around an electrified drum with magnetic field means opposite the drum behind grounded or floating shielding. Magnetic field lines are not shown.

In U.S. Pat. No. 4,863,756 to Hartig et al., the substrate is continuously moved over a sputter magnetron surface with the surface facing the magnetron located inside the dark space region of the cathode. In this way, the magnetic field of the magnetron passes through the substrate and is closed over the substrate surface constricting the plasma onto the surface.

Other Prior Art Methods and Apparatuses

In U.S. Pat. No. 4,631,106 to Nakazato et al., magnets are located under a wafer to create a magnetron type field parallel to the wafer. The magnets are moved to even out the process. The opposed plate is grounded, and the wafer platen is electrified. U.S. Pat. No. 4,761,219 to Sasaki et al. shows a magnetic field passing through a gap with the wafer on one electrode surface. U.S. Pat. No. 5,225,024 to Hanley et al. has a mirror magnetic field where a cusp field is generated to create flux lines parallel to the wafer surface. In U.S. Pat. No. 5,437,725 to Schuster et al., a metal web is drawn over a drum containing magnets.

SUMMARY

The present invention is defined by the following claims, and nothing in this section should be taken as a limitation on those claims.

By way of introduction, the preferred embodiments described below relate to a dipole ion source. In one preferred embodiment, a dipole ion source is provided comprising a substrate; a pole, wherein a gap is defined between the substrate and the pole; an unsymmetrical mirror magnetic field comprising a compressed end and a less compressed end, wherein the substrate is positioned in the less compressed end of the magnetic field; and an anode creating electric fields from both the substrate and pole surfaces that penetrate the magnetic field and confine electrons in a continuous Hall current loop, wherein the unsymmetrical magnetic field serves to focus an ion beam on the substrate.

Other preferred embodiments are provided, and each of the preferred embodiments can be used alone or in combination with one another. The preferred embodiments will now be described with reference to the attached drawings.

DETAILED DESCRIPTION OF THE PRESENTLY PREFERRED EMBODIMENTS

Figure 1:
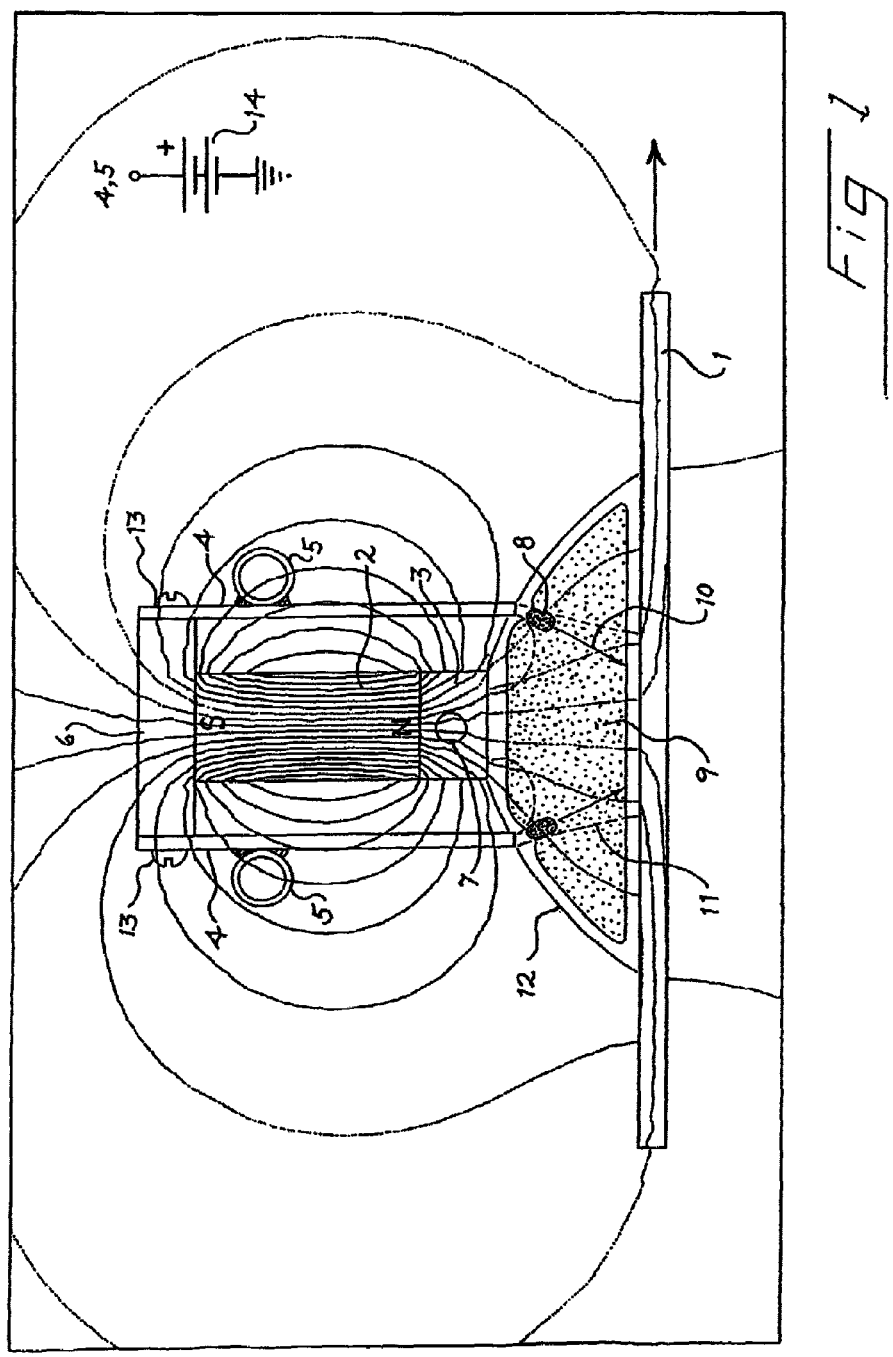
FIG. 1 shows a section view of a dipole ion source apparatus of a preferred embodiment.

FIG. 1 shows a section view of a dipole ion source. In this case, the substrate 1 is a high permeability, electrically conductive material such as steel sheet. A magnetic field is set up in the gap between the substrate 1 and magnetic pole 3 with permanent magnet 2. Pole 3 is electrically conductive and is connected to ground as is substrate 1. Pole 3 is water cooled through gun drilled hole 7. Anode 4 is water cooled with brazed on tubes 5 and is attached to support plate 6 with screws 13. Magnet 2 is an electrical insulator. The anode and magnet assembly are supported over the substrate 1 with a bracket not shown. The fundamental operation of the dipole ion source takes advantage of the understanding that the electron Hall current can be contained within a simple dipole magnetic field rather than a racetrack shaped field. This effect has been used to produce other novel sources in the following patent applications: PCT applications Ser. Nos. PCT/US02/11473 and PCT/US02/11542 and U.S. patent application Ser. No. 10/036,067, which is hereby incorporated by reference. This effect is used in a dipole ion source to create a simple, effective ion beam source with distinct advantages.

The dipole ion source power supply 14 in this case is a DC supply capable of 4000VDC. The positive electrode is connected to anode 4, and the return path is via the substrate 1 and pole 3 through ground. As shown, the source will operate very similarly to an anode layer ion source. At higher pressures, above ~3 mTorr, the source operates in a diffuse or plasma mode. In this mode, a conductive plasma 9 fills the magnetic confined region as shown, and the electric fields shift to the sheaths at the grounded and anode surfaces. At lower pressures, the conductive plasma disappears, and a distinct plasma beam 10 can be seen emanating from anode layer region 8. Without the conductive plasma 9, the static electric fields 11 dictate the electron and ion flows. This mode is termed the collimated mode. In the collimated mode, the voltage of the source is more directly proportional to power requiring the higher voltage DC supply. In the diffuse mode, voltages in the 300–600 volt range are typical.

The difference with prior art is that instead of using a racetrack magnetic field and separating the source from the substrate, the dipole magnetic field is shared between the source and substrate. There are several benefits to this arrangement:

Operation in the diffuse mode is particularly benefited. In existing grid less or anode layer ion sources, the diffuse mode presents difficulties. Firstly, the cathode poles tend to be sputter eroded contaminating the substrate and requiring expensive maintenance. Secondly, the intense plasma region is separated from the substrate. This is because the source plasma remains inside the racetrack opening between the cathode surfaces. With the dipole ion source of this preferred embodiment, the plasma is in direct contact with the substrate. As shown in FIG. 1, the substrate is a pole of the source. This allows a high degree of plasma interaction with the substrate increasing processing rates.

Pole erosion by sputtering is greatly reduced in both the diffuse and collimated modes. Pole 3 erosion is reduced due to two design factors. The magnetic mirror effect tends to push electrons and ions away from the pole reducing plasma contact. The unsymmetrical magnetic field focuses plasma ions-toward the substrate rather than the exposed pole. Also, the location of the anode close to pole 3 directionally points the ion flow toward the substrate. Additionally, because one of the two poles is the substrate, there is one less pole to erode.

Neutrality of the beam is assisted by the beam never leaving the magnetically confined region 12. This reduces glow around the chamber and particularly benefits PECVD operations where deposition occurs wherever there is glow. In these processes, spurious glow causes deposition in unwanted places causing process drift and additional maintenance.

The source is a simple, economic design. By confining the electron Hall current in a simple dipole magnetic field, long sources covering wide substrates can be readily constructed. Complex racetrack magnetic fields are not needed. The source of FIG. 1 can easily be extended to cover a 2 or 3 meter wide substrate.

Figure 2:
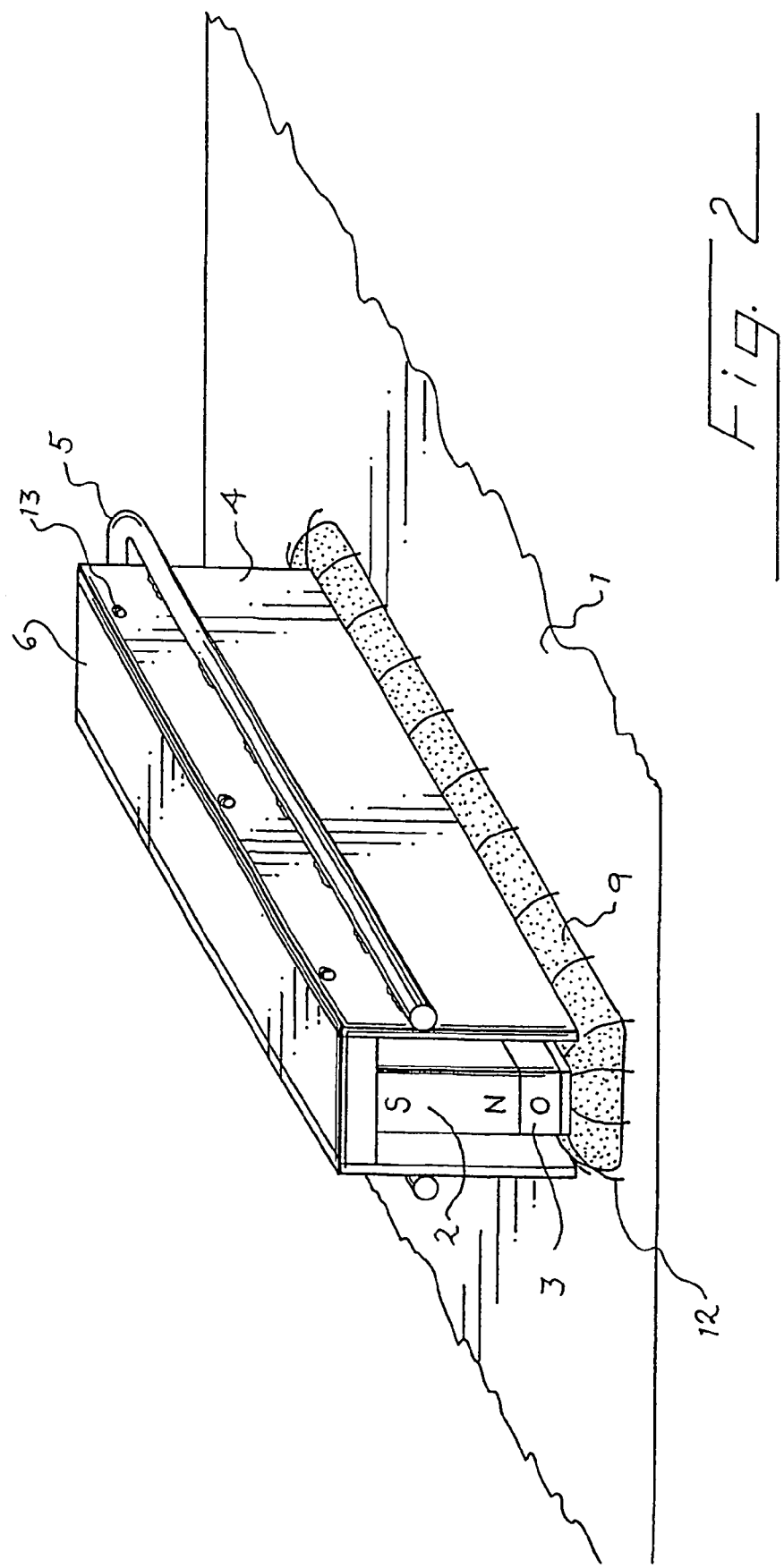
FIG. 2 shows an isometric view of the apparatus of FIG. 1.

FIG. 2 shows an isometric view of the source depicted in FIG. 1. This shows how the source can be extended to process wide substrate widths. At the end of the source, the anode 4 cover has been left off to show the internal magnet 2 and pole 3. Water cooling tube 5 passes around both sides of anode 4. The end plates of anode 4 are cooled by conduction through the anode material (such as copper) to the water cooled side regions. Plasma 9 is contained within electron magnetizing field region 12. While magnetic fields are present around and behind the plasma source, electric fields are not present to light a plasma. For safety, a grounded shield is recommended around the entire source. This is not shown for clarity, and this form of shielding is well known in the art.

Figure 3:
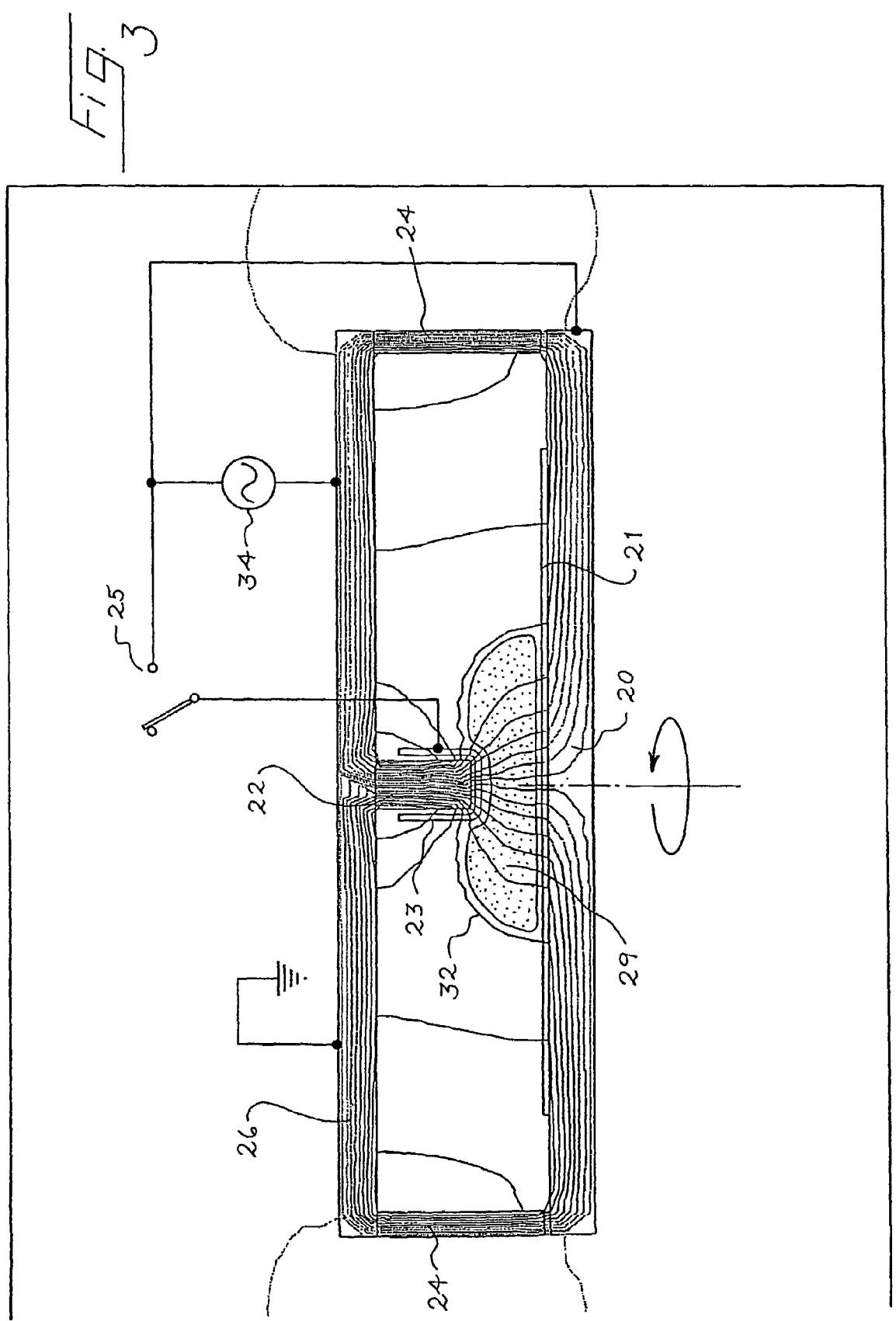
FIG. 3 shows a section view of a dipole ion source for wafer processing.

FIG. 3 shows an implementation of the preferred embodiment for semiconductor wafer processing. In this source, the wafer 21 is placed on platen 20. Platen 20 is made of a high permeability material. An unsymmetrical magnetic mirror field is generated through the wafer across a gap with magnet 22, shunt 26, and magnets 24. The mirror field is designed to expand out from magnet 22 over wafer 21. Cover 23 protects magnet 22 from the plasma and can be left either floating or can be tied to power supply 34. Magnet 22 is an electrical insulator. When cover 23 is tied to power supply 34, the source takes the form of a Penning cell. This is a very efficient magnetic plasma containment bottle. By connecting magnetic shunt 26 as the opposed electrode to platen 20, the required electric field lines are created penetrating the magnetic field lines 32 to contain the Hall current within field 32. Magnet 22 is a bar magnet long enough to span the width of the wafer. When plasma 29 is lit, the Hall current is confined and creates a bar of plasma 29 between the magnet cover 23 and wafer 21 along the length of magnet 22. Platen 20 is rotated to uniformly treat the wafer with plasma.

The uniqueness of this source has several components:

Highly energetic ion bombardment of the wafer is achieved with a dense plasma over the wafer surface. Prior art implementing RF on the wafer and an opposed electrode (where 26 is located) without a magnetic field has a less dense plasma. Sources with a magnetic field connect the equivalent of cover 23 to the opposed electrode of the power supply. This decreases the degree of electron containment and decreases overall plasma density.

The Hall current containment within the dipole magnetic field produces a line of uniform plasma over the full wafer surface. By rotating or moving the magnet or wafer, uniform processing of the wafer is possible.

The use of the mirror magnetic field at the magnet cover 23 allows the cover to be electrically floating. This dramatically reduces sputtering of cover 23. Contamination of the wafer with sputtered material and wear of cover 23 is eliminated.

The showerhead shape of the magnetic field produces a directed flow of ions toward the wafer surface. This can be tailored to suit the application. By enlarging the gap between magnet 22 and platen 20, the showerhead shape changes to an onion shape. This changes the focusing curve of the magnetic field to redirect the ion flow into the center of the gap, and ion impingement on the wafer is reduced. The ability to control the ion impingement rate and angle of impingement is a benefit of this preferred embodiment.

Figure 4:
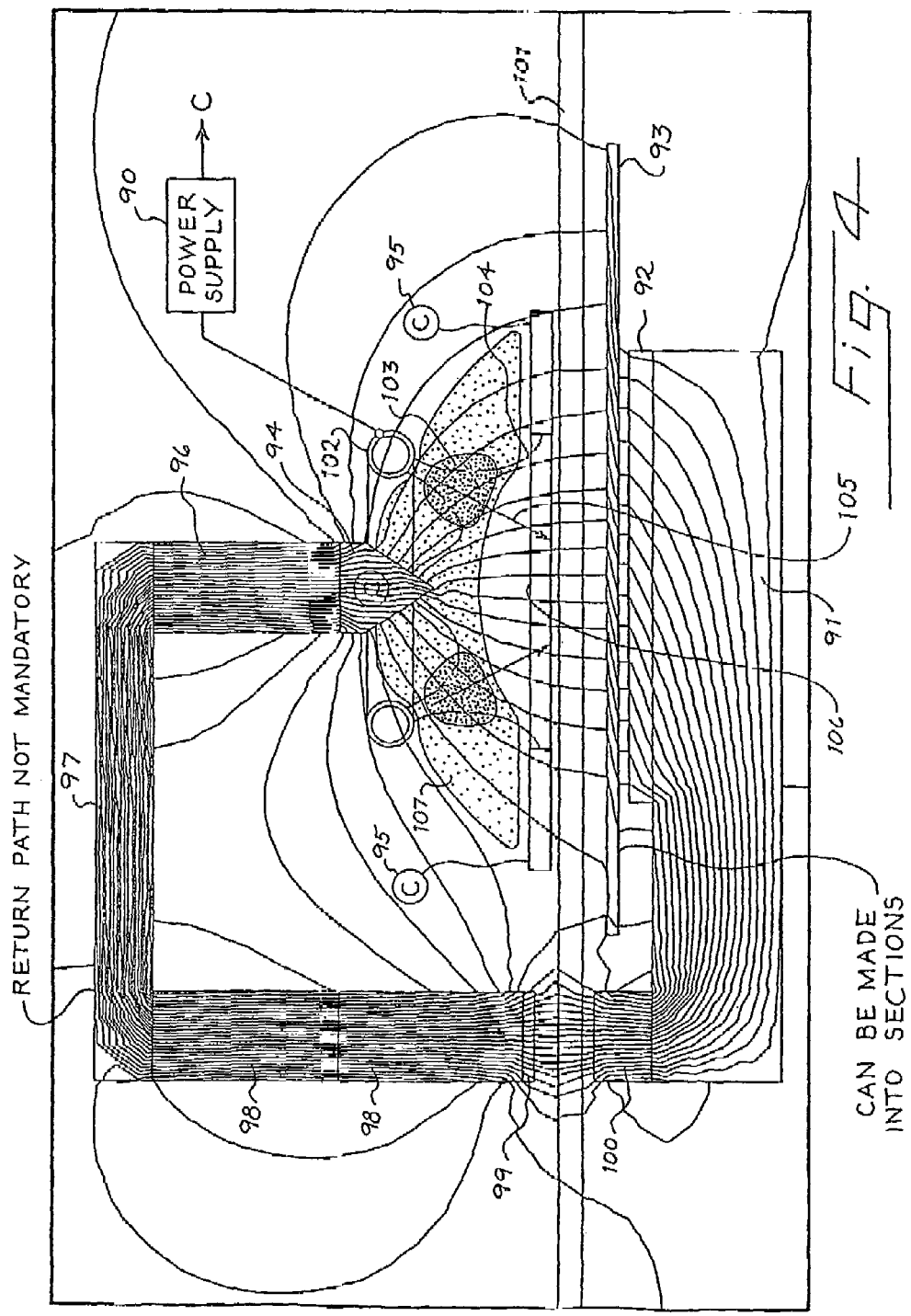
FIG. 4 shows a section view of a dipole ion source for treating planar substrates.

FIG. 4 shows a section view of a dipole ion source for processing planar electrically insulating substrates such as glass. In this source, a window 95 constructed of non-magnetic, electrically conductive metal is positioned over the substrate. The magnetic field is created per these preferred embodiments through the gap between the substrate 101 and pole 94 by permanent magnets 96, 98 and 100 and shunts 97, 91, 92 and 93. The use of a thin shunt 93 under the substrate causes the magnetic field 106 to bloom out, creating a wide showerhead field. The curving M field lines tend to focus ions like a satellite dish. With a wide showerhead field as shown, the ions are directed toward the substrate. A racetrack electron Hall current confined region is created between window 95 and pole 94 within the magnetic field lines that pass between these surfaces. Tubular ring anode 102 is positioned to interrupt a portion of the magnetic field lines passing between the window 95 and pole 94. This placement produces a version of the anode layer effect of a typical anode layer source. The benefit of this placement is that enough electrons are generated by the sharp electric field around the anode to produce a large ion flow even at pressures below 1 mTorr. This can be seen in operation as a blue flame 105 pointing toward the substrate. In an anode layer source, this is the typical collimated mode of operation. When the pressure is raised, a dense plasma 107 fills in the magnetically confined region between the window 95 and pole 94. Power supply 90 is connected between anode 102 and cathodes C, the window 95, and pole 94. This power supply can be either a DC power supply or an AC or RF supply. In the case of PECVD of an insulating coating, the use of AC or RF can allow current to pass through coating build-up on the electrode surfaces. Note that in this arrangement, either the anode or the window and pole cathodes can be grounded with the opposed electrode at the required high or low, respectively, voltage.

Figure 5:
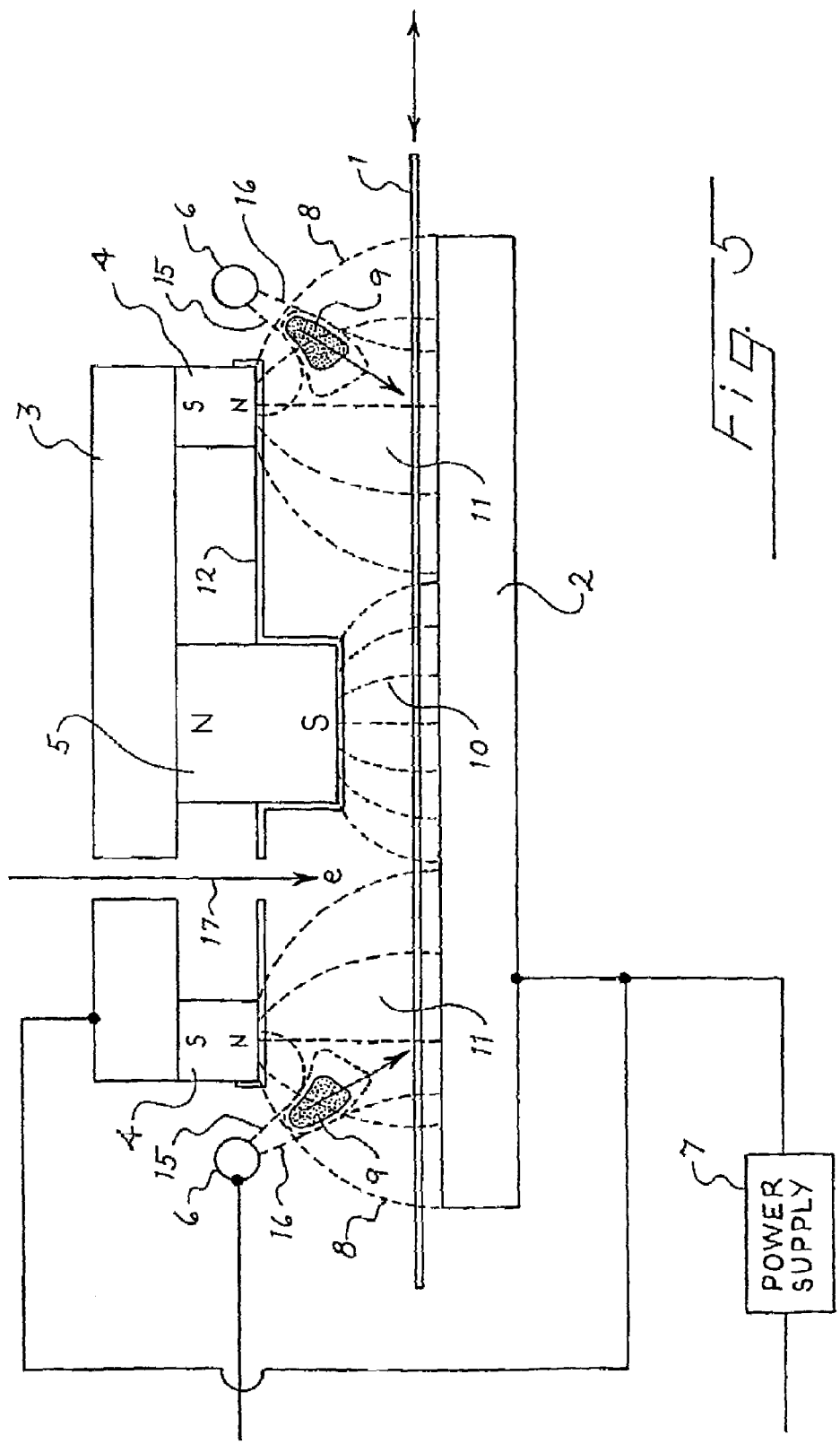
FIG. 5 shows a section view of a dipole ion source employing a central magnet to return the field.

FIG. 5 shows another version of the preferred embodiment. In this source, the primary mirror field 8 is set up around the periphery of the return magnetic field 10. Magnets 4 and 5 and shunts 2 and 3 are used to create the magnetic fields as shown. Shunt 2 is positioned under the substrate and is connected as part of one electrode of power supply 7. Substrate 1 is a dielectric material such as a polymer web and power supply 7 is an AC supply of sufficient frequency to pass current through the substrate 1. Cover 12 is electrically conductive and is connected to shunt 3 and power supply 7. Anode 6 circumvents the source as shown and is the opposed electrode to cover 12 and, effectively, substrate 1. Again, this source can be operated in either the collimated or diffuse modes. The anode 6 is shown in this view to be removed outside of the magnetic field lines 8 that pass through electrodes 12 and 2. This source will therefore operate less efficiently in the collimated mode and may require a separate source of electrons 17. Note that the electrons must be inserted between the containing magnetic field 8 and the anode for proper operation.

In this source arrangement, there is only minimal containment of electrons in the central magnetic field 10. This is because the electric fields 15 and 16 do not penetrate that far between the cover and substrate. This produces a "virtual cathode" between cover 12 and substrate 1 and causes an ion flow 11 toward the substrate. During operation, a plasma ring 9 is readily visible.

Figure 6:
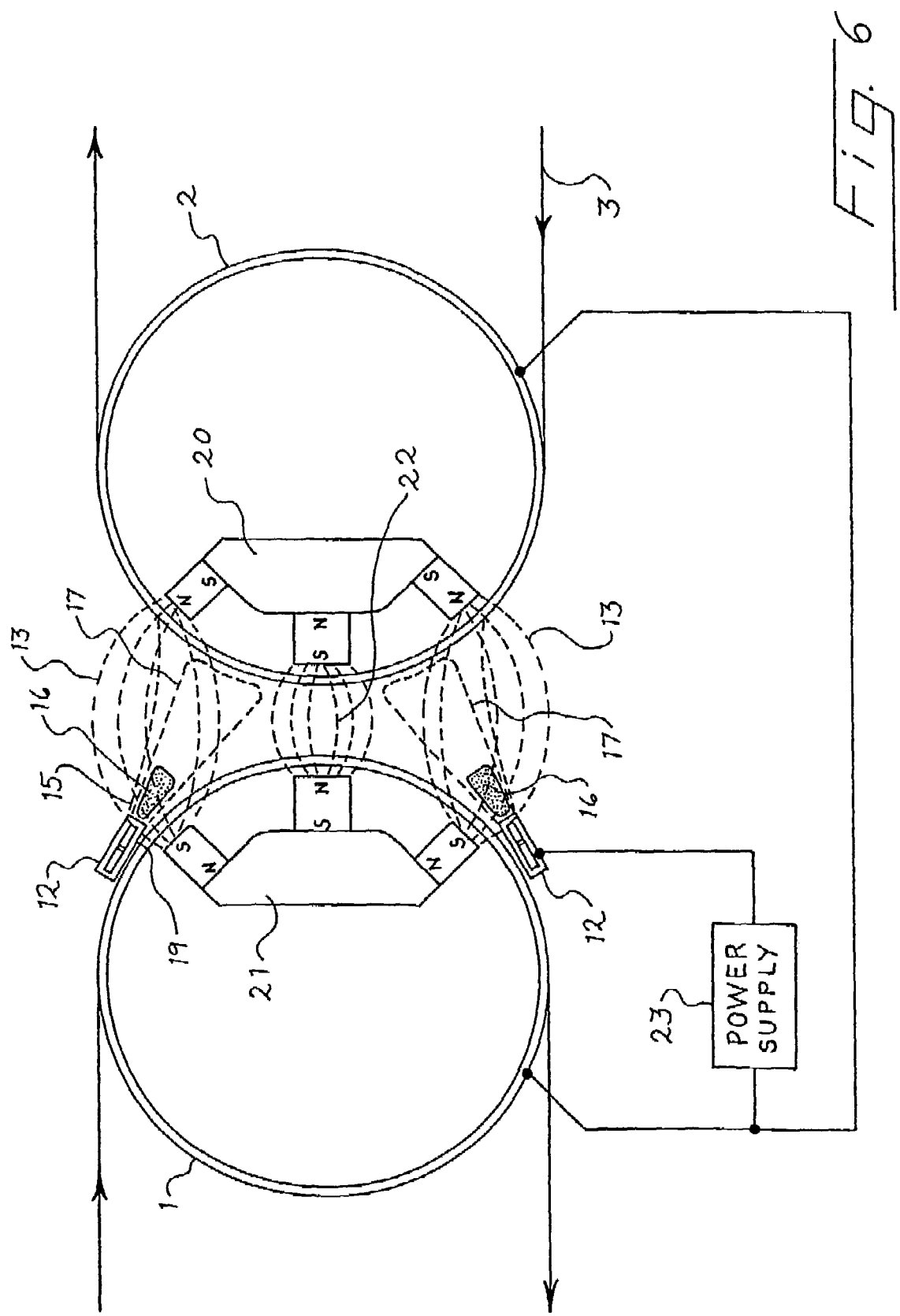
FIG. 6 shows a section view of an apparatus for treating flexible web substrates.

FIG. 6 is a section view of a source employing a central return magnetic field. In this source a flexible web substrate 3 is supported by rollers 1 and 2. Non-rotating "magnetron" magnet arrays 20 and 21 create magnetic fields 13 and 22 as shown. Magnetic field 13 forms a racetrack endless loop around field 22. Anode electrode 12 circumvents roll 1 and is a water cooled tube. Rolls 1 and 2 are connected via brushes (not shown) to power supply 23. Power supply 23 is an AC power supply of sufficient frequency to pass current effectively through dielectric substrate material 3. If the substrate is electrically conductive, a DC power supply can be used. By positioning anode 12 close to roll 1, the electric fields 15 and 19 tend to focus ions onto roll 2. The advantage of this source is that in a PECVD operation, active species formed in the plasma region are in proximity to the substrate rather than source components. This increases the rate and efficiency of the coating process and reduces cleaning maintenance. While this implementation closely follows the continuously moving Penning cell work, the concept of moving the anode to direct impinging ion flow is not well covered in that application.

Figure 7:
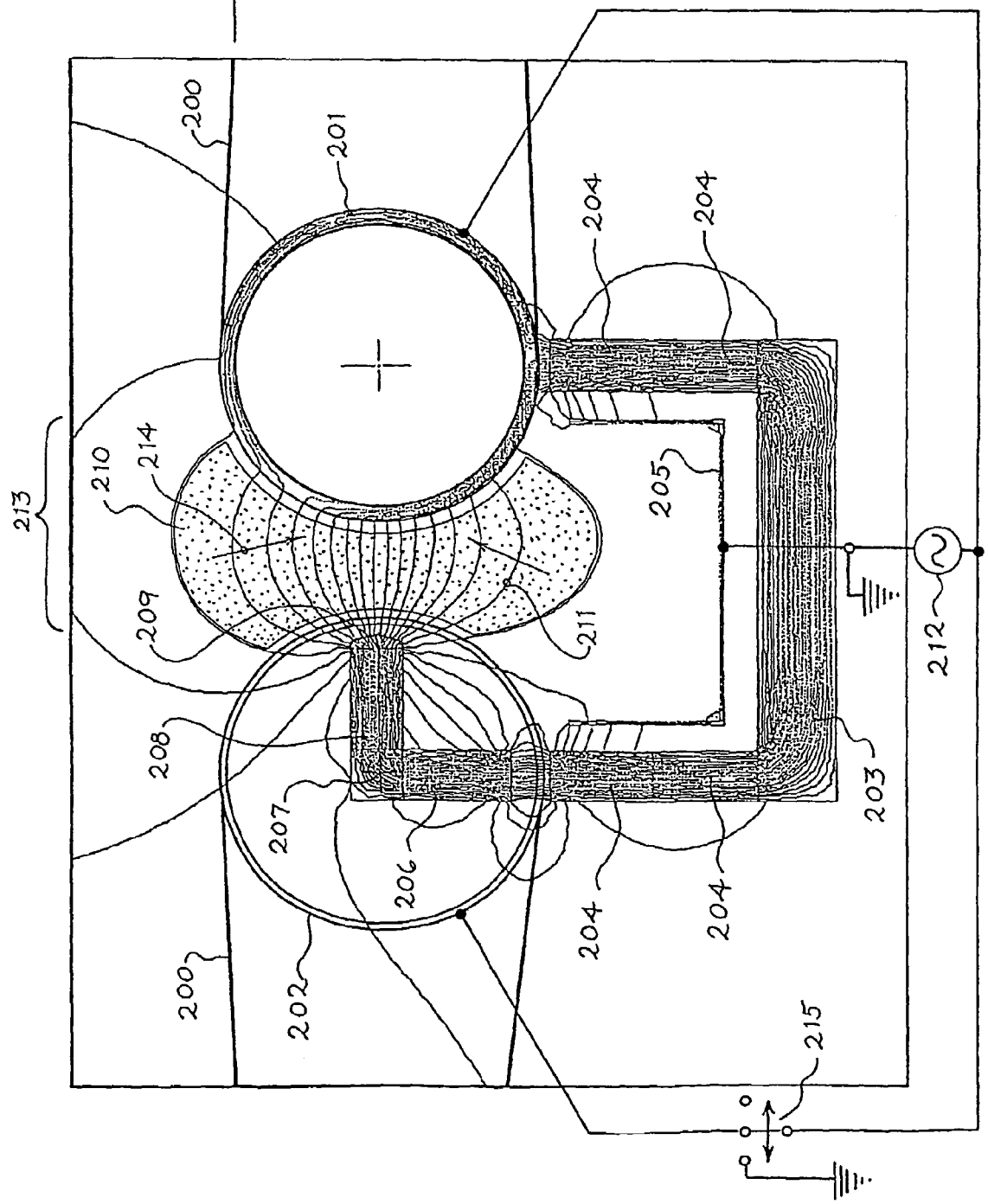
FIG. 7 shows a section view of another plasma apparatus for treating flexible web substrates.

FIG. 7 shows a section view of another web plasma source. This source is designed to operate in the diffuse mode. Two rolls 201 and 202 support web substrate 200. Roll 201 is a 400 series (magnetic) stainless steel roller. Roll 202 is constructed of non-magnetic stainless steel (300 series) and has magnets 206 and 208 and shunt 207 positioned inside the roller. Magnets 206 and 208 and shunt 207 do not rotate with roller 202. Rollers 201 and 202 are water cooled by known techniques. Unsymmetrical magnetic field 211 is created in the gap by the magnets in roller 202 and magnets 204 and shunt 203. Rolls 201 and 202 are connected to one side of power supply 212 with shunt 205 and the chamber ground as the opposed electrode. Shunt 205 also acts to collect stray magnetic field from the permanent magnet region. When power supply 212 is turned on and with gas pressure of between 1 and 100 mTorr, a plasma 210 lights between rollers 201 and 202. The conductive plasma 210 created can be used to plasma coat, plasma treat or etch the web substrate. Note that no Hall current ring is apparent in the diffuse mode of operation as the bright plasma 210 overwhelms a visible Hall ring. Several unique, useful sources can be created with variations on this theme. For instance, roll 201 can be made of a non-magnetic material. While less magnetic field will pass across the gap into roll 201, with strong magnets 206, 208, etc. sufficient field will be present to confine a plasma per the inventive method. In another variation useful with an insulating substrate 200, roller 202 (and subsequently substrate 200) may be left floating or grounded. Switch 215 is shown for the purpose of changing the electrical connection to roll 202. This can be done if the magnetic mirror field at the surface of substrate 200 on roll 202 is strong enough (the magnetic field strength at the surface of substrate 200 on roll 202 is greater than twice the strength of the field in the gap along the same field line) to repel electrons and confine the plasma. An example of usefulness is an existing coating system with an electrified, non-magnetic drum could be modified to add a floating or grounded roll 202 as shown with magnets, etc. The magnetic return path could be left off. With the substrate covering roll 202 per the inventive method, the benefits of not coating plasma facing shielding and the substrate receiving the additional plasma coating are obtained. The lowering of maintenance and increasing deposition rate are important commercial improvements to known plasma processes. Additional variations and teachings are made in PCT applications ser. nos. PCT/US02/11473 and PCT/US02/11542, both of which designate the U.S. and are being filed on the same date as the present application.

It is intended that the foregoing detailed description be understood as an illustration of selected forms that the invention can take and not as a definition of the invention. It is only the following claims, including all equivalents, that are intended to define the scope of this invention.

What is claimed is:

1. A dipole ion source comprising:
   a substrate;
   a pole, wherein a gap is defined between the substrate and the pole;
   an unsymmetrical mirror magnetic field comprising a compressed end and a less compressed end, wherein the substrate is positioned in the less compressed end of the magnetic field, wherein the pole and the substrate are charged to contain electrons; and
   an anode positioned to create an electric field penetrating the magnetic field and confining electrons in a continuous Hall current loop, wherein the unsymmetrical mirror magnetic field serves to focus an ion beam on the substrate.

2. The invention of claim 1, wherein the substrate comprises a flexible web supported by a conveyor roll.

3. The invention of claim 1, wherein the substrate comprises a rigid wafer.

4. The invention of claim 1, wherein the magnetic field is created by a permanent magnet.

5. The invention of claim 1, wherein the substrate is insulating and is biased with one of an AC or RF source.

6. The invention of claim 1, wherein the substrate is conductive and is biased with a DC source.

7. The invention of claim 1, wherein the substrate is moved relative to the magnetic field.

8. A dipole ion source comprising:
   a substrate, wherein the substrate is charged to contain electrons;
   a pole, wherein a gap is defined between the substrate and the pole;
   an unsymmetrical magnetic field comprising a compressed end and a less compressed end, wherein the substrate is positioned in the less compressed end of the magnetic field; further wherein at least a portion of the magnetic field adjacent to the pole is at least two times stronger near the pole than adjacent to the substrate surface; and
   an anode positioned to create an electric field penetrating the magnetic field and confining electrons in a continuous Hall current loop, wherein an ion beam is focused on the substrate;
   wherein the substrate is moved in relation to the magnetic field, thereby providing uniformity in treatment.

9. The invention of claim 8, wherein the pole is negatively biased to confine electrons in relation to the anode.

10. The invention of claim 8, wherein the pole is electrically connected to the substrate potential.

11. The invention of claim 8, wherein the pole is electrically floating.

12. The invention of claim 8, wherein the pole is biased at the anode potential.

13. The invention of claim 8 further comprising a magnetic field structure.

14. The invention of claim 13, wherein the magnetic field structure comprises a high permeability member.

15. The invention of claim 13, wherein the magnetic field structure comprises a magnet.

16. The invention of claim 13, wherein the magnetic field structure is located behind the substrate and the pole.

17. The invention of claim 13, wherein the magnetic field structure is located behind the pole but not the substrate.

18. The invention of claim 8, wherein the pole is covered by the substrate.

19. The invention of claim 8, wherein the pole is biased at a different potential than either the substrate or the anode.

* * * * *